United States Patent
Shrivastava et al.

(10) Patent No.: US 9,548,752 B1
(45) Date of Patent: Jan. 17, 2017

(54) CALIBRATION TECHNIQUE FOR CURRENT STEERING DAC

(71) Applicant: Texas Instruments Incorporated, Dallas, TX (US)

(72) Inventors: Neeraj Shrivastava, Bangalore (IN); Supreet Joshi, Bangalore (IN); Himanshu Varshney, Bangalore (IN); Jafar Sadique Kaviladath, Kozhikode (IN); Visvesvaraya Pentakota, Bangalore (IN); Shagun Dusad, Bangalore (IN)

(73) Assignee: TEXAS INSTRUMENTS INCORPORATION, Dallas, TX (US)

( * ) Notice: Subject to any disclaimer, the term of this patent is extended or adjusted under 35 U.S.C. 154(b) by 0 days.

(21) Appl. No.: 15/048,027

(22) Filed: Feb. 19, 2016

(30) Foreign Application Priority Data

Aug. 6, 2015 (IN) .......................... 4094/CHE/2015

(51) Int. Cl.
*H03M 1/66* (2006.01)
*H03M 1/10* (2006.01)
*H03M 1/78* (2006.01)
*H03M 1/74* (2006.01)

(52) U.S. Cl.
CPC ............ *H03M 1/1009* (2013.01); *H03M 1/66* (2013.01); *H03M 1/745* (2013.01); *H03M 1/785* (2013.01)

(58) Field of Classification Search
CPC ...... H03M 1/1009; H03M 1/66; H03M 1/745; H03M 1/785
USPC .......................................... 341/155, 144, 120
See application file for complete search history.

(56) References Cited

U.S. PATENT DOCUMENTS

| 8,441,382 | B2 * | 5/2013 | Mahajan | .............. | H03K 17/063 341/121 |
| 8,536,899 | B1 * | 9/2013 | Lu | ........................ | H03M 1/1061 327/51 |
| 8,928,513 | B1 * | 1/2015 | Waltari | .................... | H03M 1/66 341/136 |
| 9,148,160 | B2 * | 9/2015 | Zhu | ..................... | H03M 1/0863 |

\* cited by examiner

*Primary Examiner* — Brian Young
(74) *Attorney, Agent, or Firm* — John R. Pessetto; Charles A. Brill; Frank D. Cimino

(57) ABSTRACT

The disclosure provides a current steering digital to analog converter (DAC) that includes a plurality of DAC elements. At least one DAC element of the plurality of DAC elements is coupled to a calibration circuit. The calibration circuit includes a fixed current source coupled to a primary node of the DAC element through a first estimation switch. A digital code generator is coupled to the primary node, and generates a first digital code corresponding to a primary voltage generated at the primary node. The digital code generator generates a second digital code. A correction DAC is coupled to the digital code generator and generates a bias voltage based on the second digital code. The bias voltage is provided to the DAC element such that a current flowing through each DAC element of the plurality of DAC elements is equal.

21 Claims, 4 Drawing Sheets

CALIBRATION TECHNIQUE FOR CURRENT STEERING DAC

CROSS REFERENCES TO RELATED APPLICATIONS

This application claims priority from India provisional patent application No. 4094/CHE/2015 filed on Aug. 6, 2015 which is hereby incorporated by reference in its entirety.

TECHNICAL FIELD

The present disclosure is generally related to digital to analog converter (DAC), and more particularly to a calibration technique for current steering DAC.

BACKGROUND

The digital to analog converter (DAC) is widely used for signal conversion in electronic devices. The DAC converts a digital signal to an analog signal such that the analog signal can be provided to an electronic device. A current steering DAC is a widely used DAC architecture. The current steering DAC finds application in communication systems such as cell phone or base station, image processing, wireless communications, and audio-visual systems. There is an increasing demand for high resolution and high speed current steering DAC.

The current steering DAC includes multiple independent current sources. The current steering DAC has limited linearity and resolution due to current mismatch across PVT (process voltage temperature). The existing calibration techniques include off-chip calibration and on-chip calibration. The off-chip calibration is used only once. The on-chip calibration is executed every time a chip with the current steering DAC is activated. These calibration techniques are helpful when operating conditions (PVT) does not change during real time operation.

Thus, another form of calibration technique referred to as background calibration technique is utilized. The background calibration technique is useful when the operating conditions are varying and the device with the current steering DAC is running. Thus, it is important in the background calibration technique, that the current steering DAC is calibrated independent of the operating conditions.

SUMMARY

According to an aspect of the disclosure, a current steering digital to analog converter (DAC) is disclosed. The current steering DAC includes a plurality of DAC elements. At least one DAC element of the plurality of DAC elements is coupled to a calibration circuit. The calibration circuit includes a fixed current source coupled to a primary node of the DAC element through a first estimation switch. A digital code generator is coupled to the primary node, and generates a first digital code corresponding to a primary voltage generated at the primary node. The digital code generator generates a second digital code. A correction DAC is coupled to the digital code generator and generates a bias voltage based on the second digital code. The bias voltage is provided to the DAC element such that a current flowing through each DAC element of the plurality of DAC elements is equal.

BRIEF DESCRIPTION OF THE VIEWS OF DRAWINGS

DETAILED DESCRIPTION OF THE EMBODIMENTS

Figure 1:
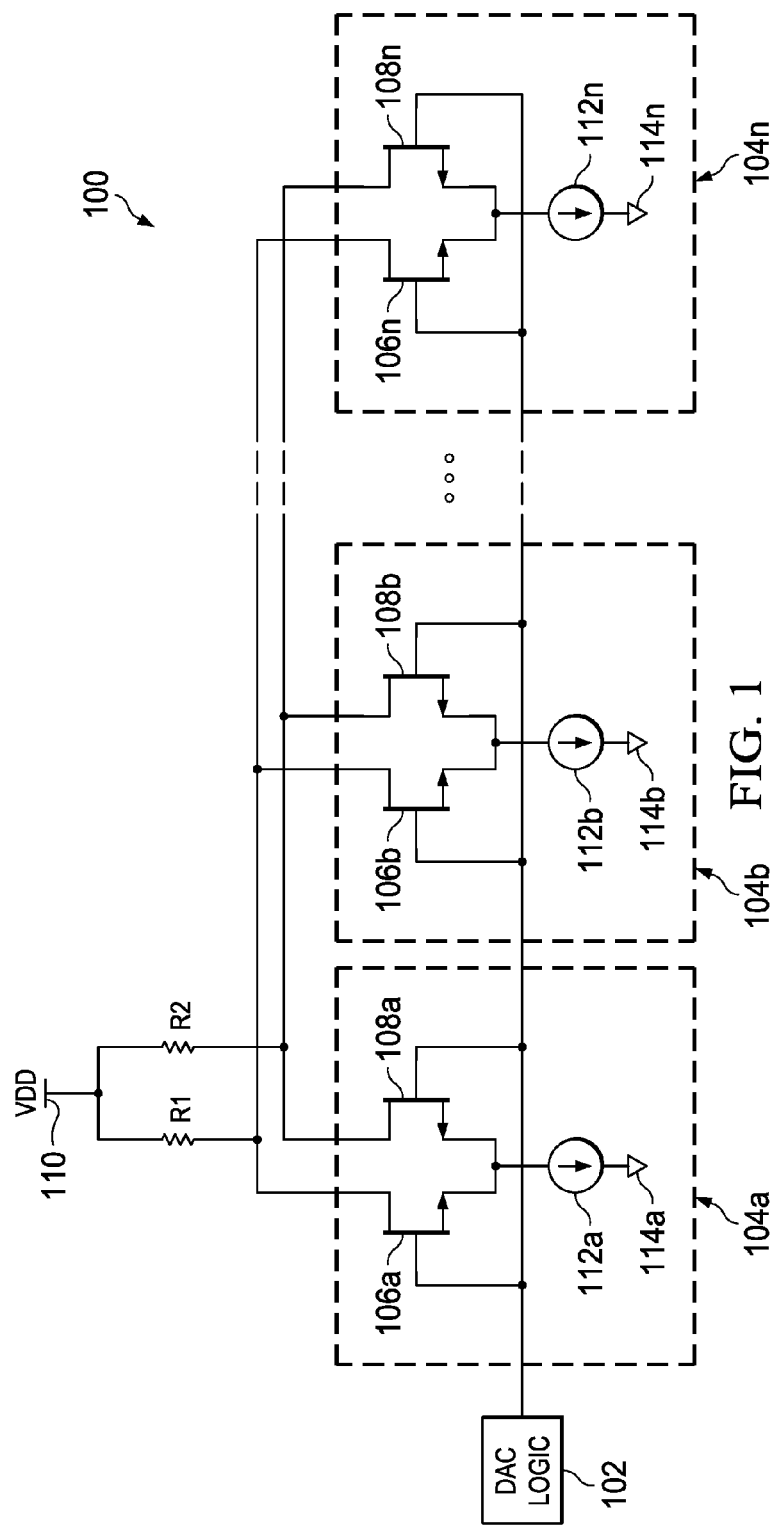
FIG. 1 illustrates a current steering digital to analog converter (DAC) in which several aspects of the present invention can be implemented.

FIG. 1 illustrates a current steering digital to analog converter (DAC) 100 in which several aspects of the present invention can be implemented. The current steering DAC 100 includes a DAC logic 102. A plurality of DAC elements illustrated as 104*a*, 104*b* to 104*n* are coupled to the DAC logic 102. Each DAC element of the plurality of DAC elements is coupled to a power source VDD 110 through a first resistor R1 and a second resistor R2. In one version, a resistance of the first resistor R1 and the second resistor R2 are equal. Each DAC element of the plurality of DAC elements is similar in connection and functionality. Hence, only one DAC element 104*a* is described here for brevity of the description.

The DAC element 104*a* includes a first switch 106*a* is coupled to the first resistor R1, and a second switch 108*a* is coupled to the second resistor R2. One end of a current source 112*a* is coupled to the first switch 106*a* and the second switch 108*a*. The other end of the current source 112*a* is coupled to a ground terminal 114*a*. The first switch 106*a* and the second switch 108*a* are coupled to the DAC logic 102. The current steering DAC 100 may include one or more additional components known to those skilled in the relevant art and are not discussed here for simplicity of the description.

The operation of the current steering DAC 100 illustrated in FIG. 1 is explained now. The DAC logic 102 receives a set of digital bits. The current steering DAC 100 generates a current corresponding to the set of digital bits. The current generated by the current steering DAC 100 is proportional to the set of digital bits. The DAC logic 102 activates one or more DAC elements of the plurality of DAC elements based on the set of digital bits. In one example, the DAC logic 102 is coupled to the plurality of DAC elements through a bus, and independently controls each DAC element of the plurality of DAC elements.

In another example, the DAC logic 102 is coupled to the plurality of DAC elements through a plurality of switches. The DAC logic 102 activates one or more switches of the plurality of switches to control each DAC element. In yet another example, the plurality of DAC elements corresponds to the set of digital bits. For example, the DAC element 104*a* corresponds to the MSB (most significant bit) in the set of digital bits, and the DAC element 104*n* corresponds to the LSB (lease significant bit) in the set of digital bits. The DAC logic 102 activates one or more DAC elements based on the set of digital bits. For example, when the DAC element 104*a* is activated by the DAC logic 102, a current flows through the current source 112*a*.

In ideal situation, a current flowing through each current source 112a to 112n is equal. However, in reality, the current flowing through each current source 112a to 112n is different. This current mismatch between the current sources varies across PVT (process voltage temperature). The tracking of temperature and other system variations is not effective when the current steering DAC 100 is used for high resolution applications. Hence, a background calibration technique is devised, to address the current mismatch, which is discussed in connection with FIG. 2 and FIG. 3.

Figure 2:
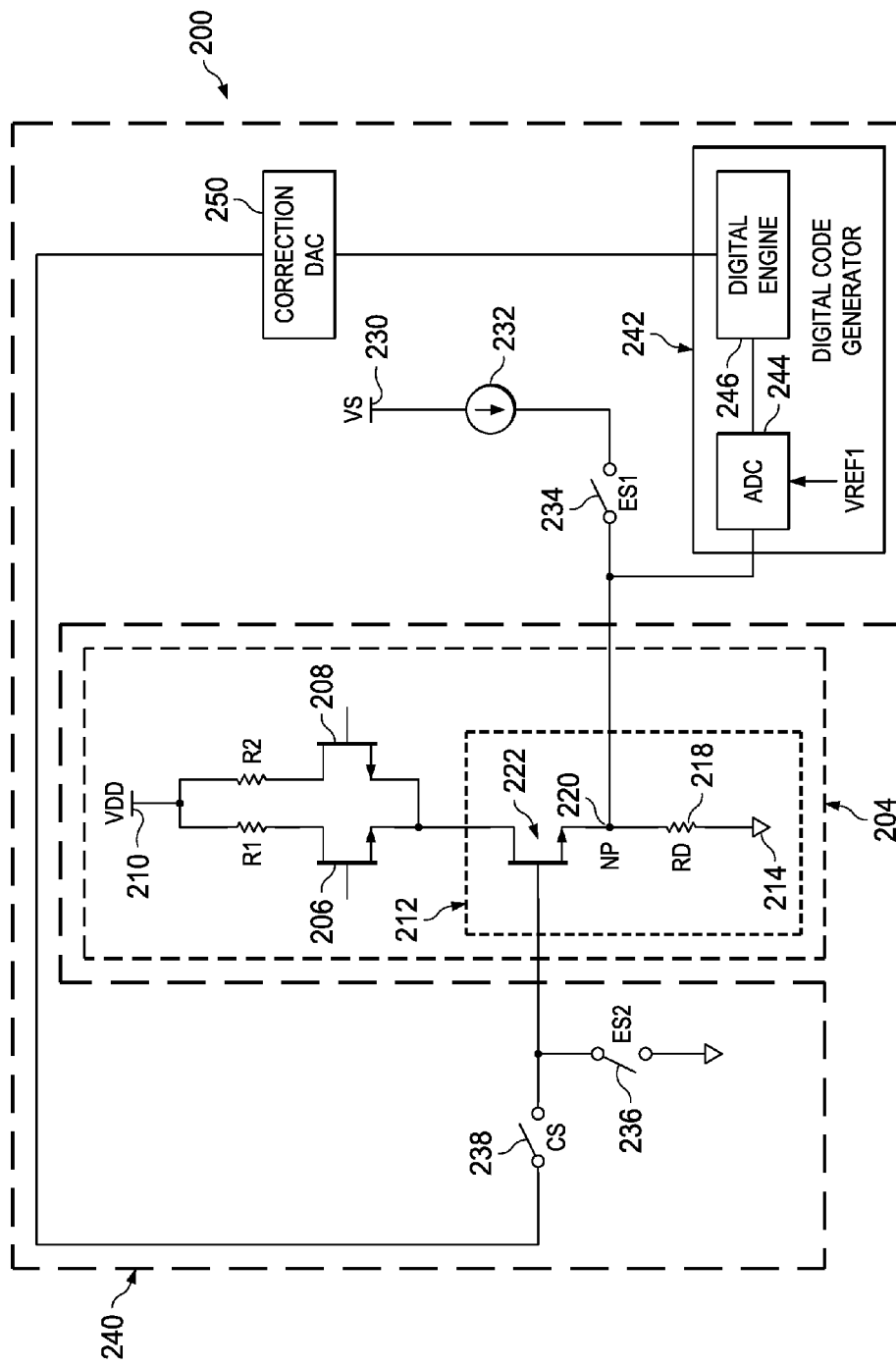
FIG. 2 illustrates a current steering digital to analog converter (DAC), according to an embodiment.

FIG. 2 illustrates a current steering digital to analog converter (DAC) 200, according to an embodiment. The current steering DAC 200 includes a DAC element 204 and a calibration circuit 240. In one example, the current steering DAC 200 is similar to the current steering DAC 100, and the DAC element 204 is one of the plurality of DAC elements 104a to 104n illustrated in FIG. 1. The DAC element 204 is similar to at least one of the plurality of DAC elements 104a to 104n, in connection and operation. In one version, the DAC element 204 is one of the DAC elements of the plurality of DAC elements 104a to 104n illustrated in FIG. 1. The DAC element 204 includes a first resistor R1 and a second resistor R2 coupled to the power source VDD 210. In one version, a resistance of the first resistor R1 and the second resistor R2 are equal. The first resistor R1 and the second resistor R2 are shared by the plurality of DAC elements as illustrated in FIG. 1. A first switch 206 is coupled to the first resistor R1, and a second switch 208 is coupled to the second resistor R2. The first switch 206 is similar to the first switch 106a (illustrated in FIG. 1) and the second switch 208 is similar to the second switch 108a (illustrated in FIG. 1)

The DAC element 204 also includes a current source 212. The current source 212 is similar to the at least one of the current sources 112a to 112n illustrated in FIG. 1, in connection and operation. One end of the current source 212 is coupled to the first switch 206 and the second switch 208. The other end of the current source 212 is coupled to a ground terminal 214. The current source 212 includes a transistor 222 coupled between the first switch 206 and a primary node NP 220. The transistor 222 is coupled to the ground terminal 214 through a second estimation switch ES2 236. A degeneration resistor Rd 218 is coupled between the primary node NP 220 and the ground terminal 214. The first switch 206 and the second switch 208 are coupled to a DAC logic similar to the DAC logic 102 illustrated in FIG. 1.

The calibration circuit 240 includes a fixed current source 232, a digital code generator 242 and a correction DAC 250. The fixed current source 232 is coupled to a secondary power source Vs 230. The fixed current source 232 is coupled to the primary node NP 220 of the DAC element 204 through a first estimation switch ES1 234. The digital code generator 242 is coupled to the primary node NP 220. The correction DAC 250 is coupled between the digital code generator 242 and the DAC element 204. The digital code generator 242 includes an analog to digital converter (ADC) 244 and a digital engine 246. The ADC 244 is coupled to the primary node NP 220 and receives a first reference voltage Vref1. The digital engine 246 is coupled to the ADC 244. In one example, the digital code generator 242 is shared across the plurality of DAC elements 104a to 104n illustrated in FIG. 1 through a multiplexer.

The correction DAC 250 is coupled to the digital engine 246. The correction DAC 250 is also coupled to the transistor 222 in the DAC element 204 through a correction switch CS 238. The current steering DAC 200, in one example, includes a plurality of calibration circuits similar to the calibration circuit 240. Each calibration circuit of the plurality of calibration circuits is coupled to a DAC element of the plurality of DAC elements. In another example, the calibration circuit 240 is coupled to the plurality of DAC elements through a multiplexer, and hence the calibration circuit 240 is used for calibration of all the DAC elements in the current steering DAC 200. The current steering DAC 200 may include one or more additional components known to those skilled in the relevant art and are not discussed here for simplicity of the description.

The operation of the current steering DAC 200 illustrated in FIG. 2 is explained now. It is understood that the DAC element 204 is one of the DAC elements of the plurality of DAC elements 104a to 104n illustrated in FIG. 1. Also, each DAC element of the plurality of DAC elements 104a to 104n is coupled to a calibration circuit similar to the calibration circuit 240. The first switch 206 and the second switch 208 are activated based on a digital input. The digital input includes a set of digital bits similar to the set of digital bits received by the DAC logic 102 in FIG. 1. The calibration circuit 240 operates in an estimation mode and a correction mode.

In the estimation mode, the first estimation switch ES1 234 and the second estimation switch ES2 236 are activated (closed). The correction switch CS 238 is inactivated (open). A current flows from the fixed current source 232 through the degeneration resistor Rd 218 to the ground terminal 214. A primary voltage is generated at the primary node NP 220. The ADC 244 generates a first digital code corresponding to the primary voltage generated at the primary node NP 220 and the first reference voltage Vref1. The digital engine 246 stores the first digital code. In one example, to further improve the accuracy in the estimation mode, the first digital code is generated multiple times, and after a defined time, an average value of the first digital code is stored in the digital engine 246.

The correction mode includes a plurality of correction cycles. The correction mode occurs in background, and hence does not impact normal operation of the current steering DAC 200. One correction cycle of the plurality of correction cycles is explained now. A correction cycle involves inactivating the first estimation switch ES1 234 and the second estimation switch ES2 236. The correction switch CS 238 is activated. The digital engine 246 generates a second digital code. The correction DAC 250 generates a bias voltage based on the second digital code. The bias voltage is provided to the transistor 222 in the DAC element 204. A new primary voltage is generated at the primary node NP 220 when the bias voltage is provided to the transistor 222 in the DAC element 204. The ADC 244 generates a third digital code corresponding to the new primary voltage generated at the primary node NP 220.

In each correction cycle, a second digital code is generated to further refine the third digital code and to make it equal to the first digital code. After the plurality of correction cycles, the third digital code is equal to the first digital code. A value of the second digital code, that is used when the third digital code is equal to the first digital code, is stored in the digital engine 246. This value of the second digital code is used to calibrate the DAC element 204 every time the current steering DAC 200 is in operation. A similar process is carried out to find a second digital code corresponding to each DAC element in the current steering DAC 200.

This ensures that a current flowing through each DAC element of the plurality of DAC elements is equal. Thus, when a calibration circuit similar to the calibration circuit 240 is used with each DAC element of the plurality of DAC elements 104a to 104n (illustrated in FIG. 1), a current flowing through each DAC element is equal. The problem of current mismatch is thus addressed by using the calibration circuit 240 in conjunction with the DAC element 204. The current mismatch estimation is performed only at power-up of a device that includes the current steering DAC 200.

The first reference voltage Vref1 is generated using a resistor similar to the degeneration resistor Rd 218 so that the primary voltage and the first reference voltage Vref1 track across PVT variations and time. Thus, because of the primary voltage tracking the first reference voltage Vref1, the current mismatch estimation is performed only at power-up of the device that includes the current steering DAC 200. Hence, even if operating conditions change while the device is in normal operation, the current mismatch estimation need not be performed. The correction mode will run in background to correct any mismatch appropriately while the device is in normal operation. The calibration circuit 240 uses the primary voltage generated at the primary node NP 220 during the estimation mode. In correction mode, the bias voltage is provided to the transistor 222 such that the primary voltage reaches a desired value. Thus, multiple correction cycles are performed in the correction mode to make the first digital code stored in the digital engine 246 equal to the third digital code.

Figure 3:
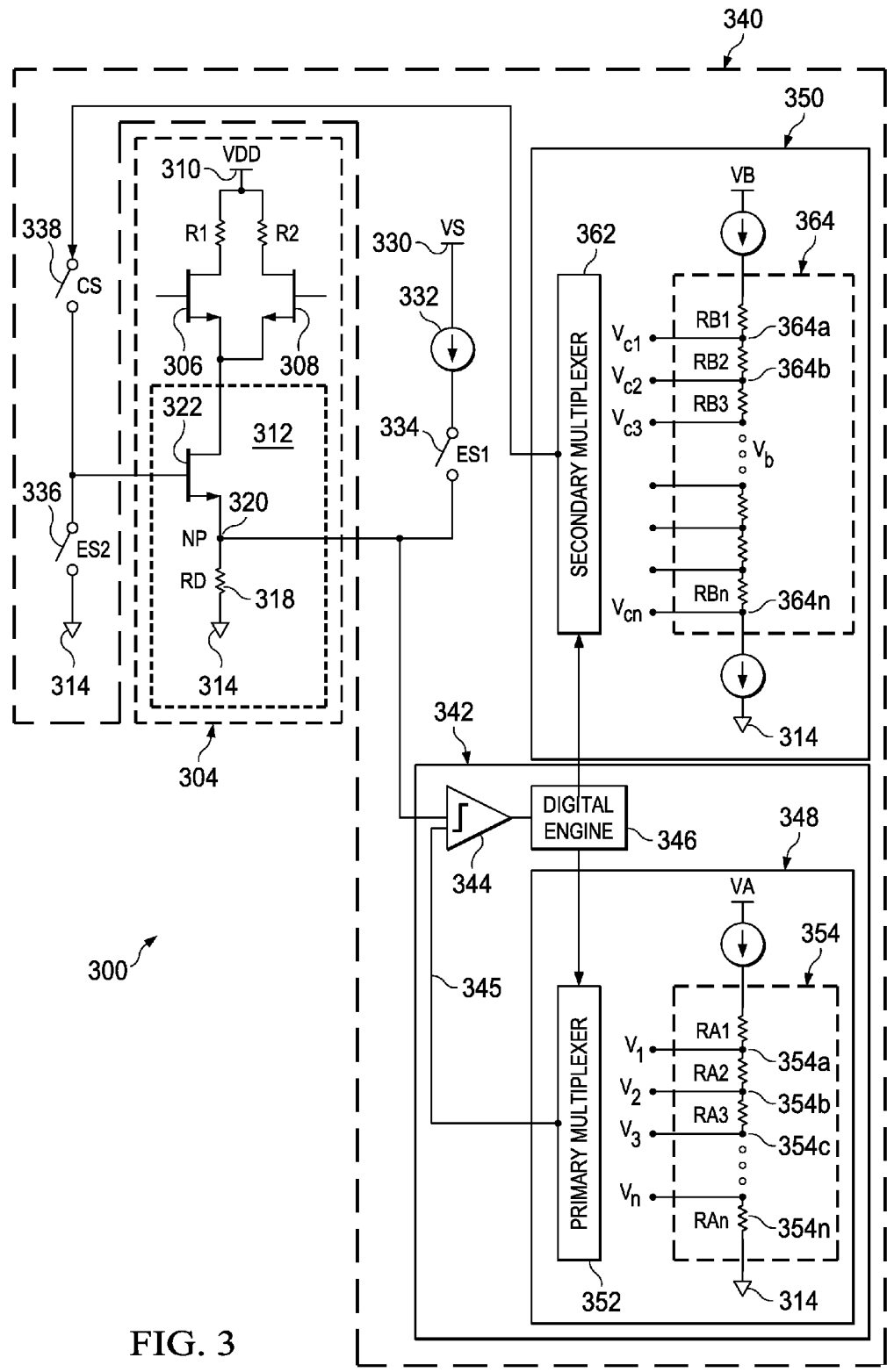
FIG. 3 illustrates a current steering digital to analog converter (DAC), according to an embodiment.

FIG. 3 illustrates a current steering digital to analog converter (DAC) 300, according to an embodiment. The current steering DAC 300 includes a DAC element 304 and a calibration circuit 340. In one example, the current steering DAC 300 is similar to the current steering DAC 100, and the DAC element 304 is one of the plurality of DAC elements 104a to 104n illustrated in FIG. 1. The DAC element 304 is similar to at least one of the plurality of DAC elements 104a to 104n, in connection and operation. In one version, the DAC element 304 is one of the DAC elements of the plurality of DAC elements 104a to 104n illustrated in FIG. 1. The DAC element 304 includes a first resistor R1 and a second resistor R2 coupled to the power source VDD 310. In one version, a resistance of the first resistor R1 and the second resistor R2 are equal. The first resistor R1 and the second resistor R2 are shared by the plurality of DAC elements as illustrated in FIG. 1. A first switch 306 is coupled to the first resistor R1, and a second switch 308 is coupled to the second resistor R2. The first switch 306 is similar to the first switch 106a (illustrated in FIG. 1) and the second switch 308 is similar to the second switch 108a (illustrated in FIG. 1)

The DAC element 304 also includes a current source 312. The current source 312 is similar to the at least one of the current sources 112a to 112n illustrated in FIG. 1, in connection and operation. One end of the current source 312 is coupled to the first switch 306 and the second switch 308. The other end of the current source 312 is coupled to a ground terminal 314. The current source 312 includes a transistor 322 coupled between the first switch 306 and a primary node NP 320. The transistor 322 is coupled to the ground terminal 314 through a second estimation switch ES2 336. A degeneration resistor Rd 318 is coupled between the primary node NP 320 and the ground terminal 314. The first switch 306 and the second switch 308 are coupled to a DAC logic similar to the DAC logic 102 illustrated in FIG. 1.

The calibration circuit 340 includes a fixed current source 332, a digital code generator 342 and a correction DAC 350. The fixed current source 332 is coupled to a secondary power source Vs 330. The fixed current source 332 is coupled to the primary node NP 320 of the DAC element 304 through a first estimation switch ES1 334. The digital code generator 342 is coupled to the primary node NP 320. The correction DAC 350 is coupled between the digital code generator 342 and the DAC element 304. The digital code generator 342 includes a comparator 344, a digital engine 346 and an estimation DAC 348. The comparator 344 is coupled to the primary node NP 320. The digital engine 346 is coupled to the comparator 344. The estimation DAC 348 is coupled to the digital engine 346. In one example, the digital code generator 342 is shared across the plurality of DAC elements 104a to 104n illustrated in FIG. 1 through a multiplexer.

The estimation DAC 348 includes a primary resistive ladder 354 coupled between a first input voltage VA and the ground terminal 314. The primary resistive ladder 354 includes a plurality of resistors illustrated as RA1, RA2, RA3 to RAN. In one example, RA1, RA2, RA3 to RAN have equal resistance value. The primary resistive ladder 354 includes voltage taps illustrated as 354a, 354b to 354n. Each voltage tap is between two successive resistors of the plurality of resistors. A plurality of voltages is generated at the voltage taps. The plurality of voltages is represented as V1, V2 to Vn. The estimation DAC 348 also includes a primary multiplexer 352 coupled to the digital engine 346. The primary multiplexer 352 receives the plurality of voltages from the primary resistive ladder 354.

The correction DAC 350 is coupled to the digital engine 346. The correction DAC 350 is also coupled to the transistor 322 in the DAC element 304 through a correction switch CS 338. The correction DAC 350 includes a secondary resistive ladder 364 coupled between a second input voltage VB and the ground terminal 314. The secondary resistive ladder 364 includes a plurality of resistors illustrated as RB1, RB2, RB3 to RBN. In one example, RB1, RB2, RB3 to RBN have equal resistance value. RB. The secondary resistive ladder 364 includes voltage taps illustrated as 364a, 364b to 364n. The secondary resistive ladder 364 also receives a secondary bias voltage Vb. The secondary bias voltage Vb is provided at the center of the secondary resistive ladder 364. Each voltage tap is between two successive resistors of the plurality of resistors. A plurality of voltages is generated at the voltage taps. The plurality of voltages is represented as Vc1, Vc2 to Vcn. In one example, a center voltage of the plurality of voltages Vc1 to Vcn is proportional to the primary voltage generated at the primary node NP 320. The correction DAC 350 also includes a secondary multiplexer 362 coupled to the digital engine 346. The secondary multiplexer 362 receives the plurality of voltages from the secondary resistive ladder 364.

The current steering DAC 300, in one example, includes a plurality of calibration circuits similar to the calibration circuit 340. Each calibration circuit of the plurality of calibration circuits is coupled to a DAC element of the plurality of DAC elements. In another example, the calibration circuit 340 is coupled to the plurality of DAC elements through a multiplexer, and hence the calibration circuit 340 is used for calibration of all the DAC elements in the current steering DAC 300. The current steering DAC 300 may include one or more additional components known to those skilled in the relevant art and are not discussed here for simplicity of the description.

The operation of the current steering DAC 300 illustrated in FIG. 3 is explained now. It is understood that the DAC element 304 is one of the DAC elements of the plurality of DAC elements 104a to 104n illustrated in FIG. 1. Also, each DAC element of the plurality of DAC elements 104a to 104n is coupled to a calibration circuit similar to the calibration circuit 340. The first switch 306 and the second switch 308 are activated based on a digital input. The digital input includes a set of digital bits similar to the set of digital bits received by the DAC logic 102 in FIG. 1. The calibration circuit 340 operates in an estimation mode and a correction mode.

In the estimation mode, the first estimation switch ES1 334 and the second estimation switch ES2 336 are activated (closed). The correction switch CS 338 is inactivated (open). A current flows from the fixed current source 332 through the degeneration resistor Rd 318 to the ground terminal 314. A primary voltage is generated at the primary node NP 320. The comparator 344 compares the primary voltage and a second reference voltage 345 to generate a first digital code. The estimation DAC 348 generates the second reference voltage 345. The digital engine 346 stores the first digital code.

The estimation mode in one version includes performing a plurality of estimation cycles. An estimation cycle of the plurality of estimation cycles involves comparing by the comparator 344, the primary voltage and the second reference voltage 345 to generate a primary digital bit. A preliminary digital code stored in the digital engine 346 is modified based on the primary digital bit. The second reference voltage 345 is generated by the primary multiplexer 352 based on the preliminary digital code. The preliminary digital code after the plurality of estimation cycles is the first digital code corresponding to the primary voltage The correction mode includes a plurality of correction cycles. The correction mode occurs in background, and hence does not impact normal operation of the current steering DAC 300. One correction cycle of the plurality of correction cycles is explained now. A correction cycle involves inactivating the first estimation switch ES1 334 and the second estimation switch ES2 336. The correction switch CS 338 is activated. The digital engine 346 generates a second digital code. The correction DAC 350 generates a bias voltage based on the second digital code. The bias voltage is provided to the transistor 322 in the DAC element 304. A new primary voltage is generated at the primary node NP 320 when the bias voltage is provided to the transistor 322 in the DAC element 304. The comparator 344 generates a third digital code corresponding to the new primary voltage generated at the primary node NP 320.

In each correction cycle, a second digital code is generated to further refine the third digital code and to make it equal to the first digital code. After the plurality of correction cycles, the third digital code is equal to the first digital code. A value of the second digital code, that is used when the third digital code is equal to the first digital code, is stored in the digital engine 346. This value of the second digital code is used to calibrate the DAC element 304 every time the current steering DAC 300 is in operation. A similar process is carried out to find a second digital code corresponding to each DAC element in the current steering DAC 300.

This ensures that a current flowing through each DAC element of the plurality of DAC elements is equal. Thus, when a calibration circuit similar to the calibration circuit 340 is used with each DAC element of the plurality of DAC elements 104a to 104n (illustrated in FIG. 1), a current flowing through each DAC element is equal. The problem of current mismatch is thus addressed by using the calibration circuit 340 in conjunction with the DAC element 304. The current mismatch estimation is performed only at power-up of a device that includes the current steering DAC 300.

The second reference voltage 345 is generated from the primary resistive ladder 354. The value of the resistance in the primary resistive ladder used for generating the second reference voltage 345 is equal to the value of the degeneration resistor Rd 318 so that the second reference voltage 345 and the primary voltage track across PVT variations and time. Thus, because of the primary voltage tracking the second reference voltage 345, the current mismatch estimation is performed only at power-up of the device that includes the current steering DAC 300. Hence, even if operating conditions change while the device is in normal operation, the current mismatch estimation need not be performed. The correction mode will run in background to correct any mismatch appropriately while the device is in normal operation. The calibration circuit 340 uses the primary voltage generated at the primary node NP 320 during the estimation mode. In correction mode, the bias voltage is provided to the transistor 322 such that the primary voltage reaches a desired value. Thus, multiple correction cycles are performed in the correction mode to make the first digital code stored in the digital engine 346 equal to the third digital code.

Figure 4:
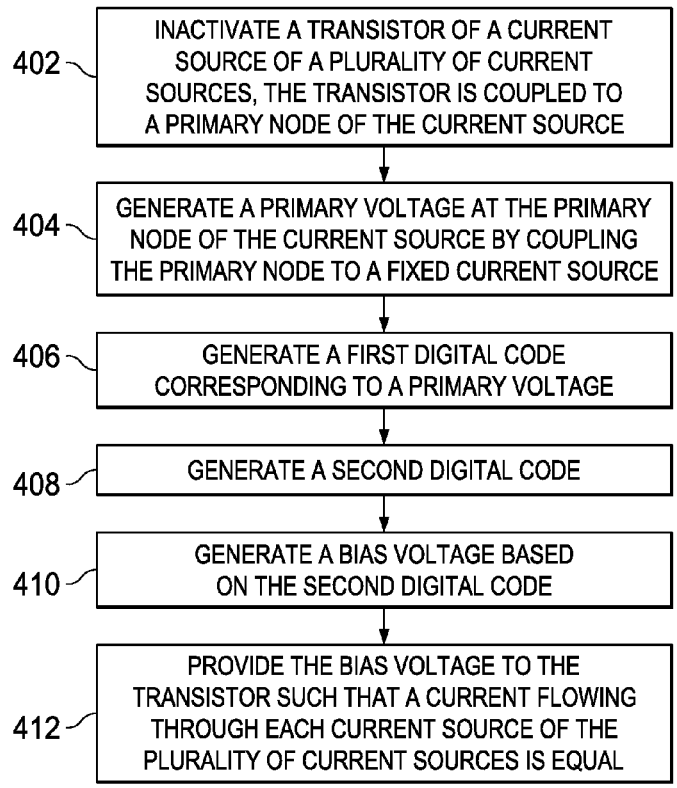
FIG. 4 is a flowchart illustrating a method according to an embodiment.

FIG. 4 is a flowchart 400 illustrating a method according to an embodiment. The flowchart is explained in connection with the current steering DAC 300 illustrated in FIG. 3. At step 402, a transistor of a current source of a plurality of current sources is inactivated. For example, in the current steering DAC 300, the second estimation switch ES2 336 is activated and the correction switch CS 338 is inactivated, to inactivate the transistor 322 in the current source 312. The current source is one of the plurality of current sources for example the plurality of current sources 112a to 112n illustrated in FIG. 1.

The transistor is coupled to a primary node of the current source. For example, the transistor 322 is coupled to the primary node NP 320. At step 404, the primary node is coupled to a fixed current source to generate a primary voltage at the primary node of the current source. In current steering DAC 300, the first estimation switch ES1 334 is activated to couple the fixed current source 332 to the primary node NP 320. A primary voltage is generated at the primary node NP 320.

At step 406, a first digital code is generated corresponding to the primary voltage. In one version, an ADC (analog to digital converter) generates the first digital code in response to the primary voltage. In another version, a comparator compares the primary voltage and a second reference voltage to generate the first digital code. A second digital code is generated at step 408. In one example, a digital engine for example digital engine 346 generates the second digital code.

At step 410, a bias voltage is generated based on the second digital code. The correction DAC 350 in the current steering DAC 300 generates a bias voltage based on the second digital code. At step 412, the bias voltage is provided to the transistor such that a current flowing through each current source of the plurality of current source is equal. A new primary voltage is generated at the primary node when the bias voltage is provided to the transistor. A third digital code is generated corresponding to the new primary voltage generated at the primary node.

A value of the second digital code, that is used when the third digital code is equal to the first digital code, is stored in a digital engine. This value of the second digital code is used to calibrate the current source. A similar process is carried out to find a second digital code corresponding to each current source of the plurality of current sources.

The problem of current mismatch is thus addressed by using the fixed current source in conjunction with the current source. The primary voltage generated at the primary node NP 320 is used to generate the first digital code and the second digital code. The bias voltage is provided to the transistor such that the primary voltage reaches a desired value. This ensures that a current flowing through each current source of the plurality of current sources is equal.

Figure 5:
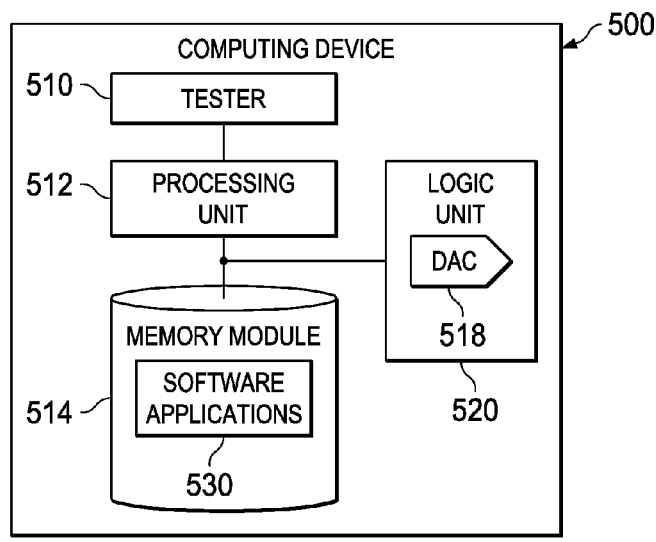
FIG. 5 illustrates a computing device, according to an embodiment.

FIG. 5 illustrates a computing device 500, according to an embodiment. The computing device 500 is, or is incorporated into, a mobile communication device, such as a mobile phone, a personal digital assistant, a transceiver, a personal computer, or any other type of electronic system. The computing device 500 may include one or more additional components known to those skilled in the relevant art and are not discussed here for simplicity of the description.

In some embodiments, the computing device 500 comprises a megacell or a system-on-chip (SoC) which includes a processing unit 512 such as a CPU (Central Processing Unit), a memory module 514 (e.g., random access memory (RAM)) and a tester 510. The processing unit 512 can be, for example, a CISC-type (Complex Instruction Set Computer) CPU, RISC-type CPU (Reduced Instruction Set Computer), or a digital signal processor (DSP).

The memory module 514 (which can be memory such as RAM, flash memory, or disk storage) stores one or more software applications 530 (e.g., embedded applications) that, when executed by the processing unit 512, performs any suitable function associated with the computing device 500. The tester 510 comprises logic that supports testing and debugging of the computing device 500 executing the software applications 530.

For example, the tester 510 can be used to emulate a defective or unavailable component(s) of the computing device 500 to allow verification of how the component(s), were it actually present on the computing device 500, would perform in various situations (e.g., how the component(s) would interact with the software applications 530). In this way, the software applications 530 can be debugged in an environment which resembles post-production operation.

The processing unit 512 typically comprises memory and logic which store information frequently accessed from the memory module 514. The computing device 500 includes a logic unit 520. The logic unit 520 is coupled to the processing unit 512 and the memory module 514. The logic unit 520 includes a current steering DAC 518. The current steering DAC 518 is similar in connection and operation to at least one of the current steering DAC 200 and the current steering DAC 300. The current steering DAC 518 includes a plurality of current sources similar to the plurality of current sources 112a to 112n illustrated in FIG. 1. The current steering DAC 518 also includes a calibration circuit coupled to a current source of the plurality of current sources.

The current steering DAC 518 operates in an estimation mode and a correction mode. A primary voltage is generated at the primary node of a current source in the current steering DAC 518. In estimation mode, a first digital code is generated based on the primary voltage. The correction mode includes a plurality of correction cycles. A correction cycle involves generating a second digital code. A bias voltage is generated based on the second digital code. The bias voltage is provided to a transistor in the current source. A new primary voltage is generated at the primary node when the bias voltage is provided to the transistor. A third digital code is generated corresponding to the new primary voltage. After the plurality of correction cycles, the third digital code is equal to the first digital code.

A value of the second digital code, that is used when the third digital code is equal to the first digital code, is stored in a digital engine. This value of the second digital code is used to calibrate the current source. A similar process is carried out to find a second digital code corresponding to each current source of the plurality of current sources. This ensures that a current flowing through each current source of the plurality of current sources is equal.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A current steering digital to analog converter (DAC) comprising:
   a plurality of DAC elements, at least one DAC element of the plurality of DAC elements coupled to a calibration circuit, the calibration circuit comprising:
      a fixed current source coupled to a primary node of the DAC element through a first estimation switch;
      a digital code generator coupled to the primary node, and configured to generate a first digital code corresponding to a primary voltage generated at the primary node, the digital code generator configured to generate a second digital code; and
      a correction DAC coupled to the digital code generator and configured to generate a bias voltage based on the second digital code, the bias voltage is provided to the DAC element such that a current flowing through each DAC element of the plurality of DAC elements is equal.

2. The current steering DAC of claim 1, wherein each DAC element of the plurality of DAC element comprises:
   a first resistor and a second resistor coupled to a power source;
   a first switch coupled to the first resistor, and a second switch coupled to the second resistor, the first switch and the second switch are configured to be activated based on a digital input; and
   a current source coupled to the first switch and the second switch, the current source comprising:
      a transistor coupled between the first switch and the primary node, the transistor configured to receive the bias voltage from the correction DAC through a correction switch and the transistor coupled to a ground terminal through a second estimation switch; and
      a degeneration resistor coupled between the primary node and the ground terminal.

3. The current steering DAC of claim 1, wherein the digital code generator comprises:
   an analog to digital converter (ADC) coupled to the primary node and configured to receive a first reference voltage; and
   a digital engine coupled to the ADC and the correction DAC.

4. The current steering DAC of claim 3, wherein the calibration circuit is configured to operate in an estimation mode and a correction mode, wherein in the estimation mode:
  the first estimation switch and the second estimation switch are configured to be activated, and the correction switch is configured to be inactivated;
  the ADC is configured to generate the first digital code corresponding to the primary voltage at the primary node; and
  the digital engine is configured to store the first digital code.

5. The current steering DAC of claim 4, wherein the correction mode comprises a plurality of correction cycles, one correction cycle of the plurality of correction cycle comprises:
  the first estimation switch and the second estimation switch are configured to be inactivated, and the correction switch is configured to be activated;
  the digital engine is configured to generate the second digital code;
  the correction DAC is configured to generate the bias voltage based on the second digital code, wherein a new primary voltage is generated at the primary node when the bias voltage is provided to the DAC element; and
  the ADC is configured to generate a third digital code corresponding to the new primary voltage generated at the primary node.

6. The current steering DAC of claim 5, wherein after the plurality of correction cycles the third digital code is equal to the first digital code, and the digital engine is configured to store the second digital code for which the third digital code is equal to the first digital code.

7. The current steering DAC of claim 1, wherein the digital code generator comprises:
  a comparator coupled to the primary node, the comparator configured to compare the primary voltage and a second reference voltage to generate the first digital code;
  a digital engine coupled to the comparator and configured to store the first digital code; and
  an estimation DAC coupled to the digital engine, and configured to generate the second reference voltage.

8. The current steering DAC of claim 7, wherein the estimation DAC further comprises:
  a primary resistive ladder coupled between a first input voltage and the ground terminal, the primary resistive ladder having a plurality of resistors with voltage taps between two successive resistors of the plurality of resistors; and
  a primary multiplexer coupled to the primary resistive ladder, and configured to generate the second reference voltage.

9. The current steering DAC of claim 1, wherein the correction DAC comprises:
  a secondary resistive ladder coupled between a second input voltage and the ground terminal, the secondary resistive ladder having a plurality of resistors with voltage taps between two successive resistors of the plurality of resistors; and
  a secondary multiplexer coupled to the secondary resistive ladder, and configured to provide the bias voltage to the transistor through the correction switch.

10. A current steering DAC comprising:
  a plurality of current sources, at least one current source comprising:
    a transistor coupled between a first switch and a primary node; and
    a degeneration resistor coupled between the primary node and a ground terminal;
  a calibration circuit coupled to at least one current source of the plurality of current sources, the calibration circuit comprising:
    a fixed current source coupled to the primary node through a first estimation switch; and
    a digital code generator coupled to the primary node, and configured to generate a first digital code corresponding to a primary voltage generated at the primary node.

11. The current steering DAC of claim 10, wherein the digital code generator comprises:
  an analog to digital converter (ADC) coupled to the primary node and configured to receive a first reference voltage; and
  a digital engine coupled to the ADC.

12. The current steering DAC of claim 10, wherein the digital code generator comprises:
  a comparator coupled to the primary node, the comparator configured to compare the primary voltage and a second reference voltage to generate the first digital code;
  a digital engine coupled to the comparator and configured to store the first digital code; and
  an estimation DAC coupled to the digital engine, and configured to generate the second reference voltage.

13. The current steering DAC of claim 10 further comprising a correction DAC coupled to the digital code generator and configured to provide a bias voltage to the current source based on a second digital code such that a current flowing through each current source of the plurality of current sources is equal.

14. The current steering DAC of claim 10, wherein:
  the transistor is configured to receive the bias voltage from the correction DAC through a correction switch and the transistor is coupled to the ground terminal through a second estimation switch.

15. A method of estimating mismatch in a plurality of current sources in a current steering DAC, the method comprising:
  inactivating a transistor of a current source of the plurality of current sources, the transistor is coupled to a primary node of the current source;
  generating a primary voltage at the primary node of the current source by coupling the primary node to a fixed current source;
  generating a first digital code corresponding to a primary voltage;
  generating a second digital code;
  generating a bias voltage based on the second digital code; and
  providing the bias voltage to the transistor such that a current flowing through each current source of the plurality of current sources is equal.

16. The method of claim 15, wherein generating the first digital code corresponding to the primary voltage further comprises comparing the primary voltage and a first reference voltage, the first digital code is stored in a digital engine.

17. The method of claim 15, wherein generating the first digital code further comprises performing a plurality of estimation cycles, and an estimation cycle of the plurality of estimation cycles comprises:
  comparing the primary voltage and a second reference voltage to generate a primary digital bit;

modifying a preliminary digital code based on the primary digital bit; and generating the second reference voltage based on the preliminary digital code.

18. The method of claim 17, wherein the preliminary digital code after the plurality of estimation cycles is the first digital code corresponding to the primary voltage.

19. The method of claim 15, wherein generating the bias voltage based on the second digital code further comprises performing a plurality of correction cycles, and a correction cycle comprises:

generating the bias voltage based on the second digital code, wherein a new primary voltage is generated at the primary node when the bias voltage is provided to the transistor; and generating a third digital code corresponding to the new primary voltage.

20. The method of claim 19, wherein after plurality of correction cycles the third digital code is equal to the first digital code, and the digital engine is configured to store the second digital code for which the third digital code is equal to the first digital code.

21. A computing device comprising:

a processing unit;

a memory module coupled to the processing unit; and a logic unit coupled to the processing unit and the memory module, the logic unit comprising a current steering digital to analog converter (DAC), the current steering DAC comprising:

a plurality of DAC elements, at least one DAC element of the plurality of DAC elements coupled to a calibration circuit, the calibration circuit comprising:

a fixed current source coupled to a primary node of the DAC element through a first estimation switch;

a digital code generator coupled to the primary node, and configured to generate a first digital code corresponding to a primary voltage generated at the primary node, the digital code generator configured to generate a second digital code; and a correction DAC coupled to the digital code generator and configured to generate a bias voltage based on the second digital code, the bias voltage is provided to the DAC element such that a current flowing through each DAC element of the plurality of DAC elements is equal.

* * * * *